United States Patent
Bez et al.

(10) Patent No.: US 8,098,069 B1
(45) Date of Patent: Jan. 17, 2012

(54) ADAPTIVE CLOSURE WITH REMOVABLE VENT FOR SEALING CONTAINERS AND METHOD OF USE

(75) Inventors: Eckhard Bez, Littleton, MA (US); Melanie Rosay, Bedford, MA (US)

(73) Assignee: Bruker Biospin Corporation, Billerica, MA (US)

( * ) Notice: Subject to any disclaimer, the term of this patent is extended or adjusted under 35 U.S.C. 154(b) by 291 days.

(21) Appl. No.: 12/425,833

(22) Filed: Apr. 17, 2009

(51) Int. Cl.
*G01V 3/00* (2006.01)

(52) U.S. Cl. ............................................ 324/318

(58) Field of Classification Search .......... 324/300–322; 600/410–435
See application file for complete search history.

(56) References Cited

U.S. PATENT DOCUMENTS

| | | | | |
|---|---|---|---|---|
| 3,939,044 A * | 2/1976 | Wilkins et al. | ................... | 435/30 |
| 3,976,579 A * | 8/1976 | Bennett | ........................ | 210/516 |
| 3,986,962 A * | 10/1976 | Kessler | ......................... | 210/516 |
| 4,111,326 A * | 9/1978 | Percarpio | ..................... | 215/247 |
| 4,186,840 A * | 2/1980 | Percarpio | ..................... | 215/247 |
| 4,187,952 A * | 2/1980 | Percarpio | ..................... | 215/247 |
| 4,226,333 A * | 10/1980 | Percarpio | ..................... | 215/247 |
| 4,257,886 A * | 3/1981 | Kessler | ......................... | 210/516 |
| 4,290,534 A * | 9/1981 | Percarpio | ..................... | 215/247 |
| 4,295,572 A * | 10/1981 | Percarpio | ..................... | 215/247 |
| 4,301,936 A * | 11/1981 | Percarpio | ..................... | 215/247 |
| 4,338,764 A * | 7/1982 | Percarpio | ........................ | 53/432 |
| 5,146,166 A | 9/1992 | Bartuska | | |
| 5,554,125 A * | 9/1996 | Reynolds | ..................... | 604/187 |
| 5,580,358 A * | 12/1996 | Narusawa et al. | ........... | 29/25.03 |
| 5,918,620 A * | 7/1999 | Rauber | ..................... | 137/15.09 |
| 6,054,857 A | 4/2000 | Doty | | |
| 6,240,788 B1 * | 6/2001 | Balestracci | ................ | 73/862.01 |
| 6,488,342 B1 * | 12/2002 | De Paiva | .................... | 301/108.1 |
| 6,812,706 B2 | 11/2004 | Leung et al. | | |
| 6,936,771 B2 * | 8/2005 | Sinha et al. | ................. | 174/125.1 |

\* cited by examiner

*Primary Examiner* — Dixomara Vargas
(74) *Attorney, Agent, or Firm* — Law Offices of Paul E. Kudirka

(57) ABSTRACT

A closed container having a single opening is sealed by a plug fabricated from a self-sealing elastomer. Before insertion, the plug is transfixed with a tube to allow air to escape as the plug is pushed into the container. The plug and tube are then inserted into a container. After the plug has been seated in the container, the tube is withdrawn, allowing the self-sealing elastomeric material to close the canal formed by the tube and to form a hermetic seal.

18 Claims, 2 Drawing Sheets

ADAPTIVE CLOSURE WITH REMOVABLE VENT FOR SEALING CONTAINERS AND METHOD OF USE

BACKGROUND

Nuclear magnetic resonance (NMR) is a physical phenomenon involving quantum mechanical magnetic properties of atomic nuclei in the presence of an applied, external magnetic field. NMR phenomena can be observed with an NMR spectrometer and used to study molecular physics, crystalline and non-crystalline materials. In particular, nuclear spin phenomena can be used to generate a spectrum comprised of a pattern of lines representing the various spins and spin interactions.

In solid materials, the nuclear spins experience a great number of interactions that produce very broad and featureless lines. However, the interactions are time-dependent and can be averaged by physically spinning the sample (at high rotation speeds up to 70 kHz) at an inclination of the so-called magic angle (54.74°) with respect to the direction of the external magnetic field. The averaging causes the normally broad lines become narrower, increasing the resolution for better identification and analysis of the spectrum.

The sample in magic angle spinning experiments is typically contained in a cylindrical sample rotor, which is a container that is permanently closed at one end and sealed by a plug or insert at the other end or may be sealed with plugs at both ends. As many experiments are performed on wet samples (for example, hydrated proteins) or samples that are liquid at room temperature and frozen for experiments, it is desirable that the seal remain completely liquid-tight even after repeated thermal cycling to cryogenic temperatures. In addition, since the plug must be slid into the rotor container after the sample has been inserted, some provision must be made for allowing air trapped between the sample and the plug to escape. Otherwise the trapped air will push the plug out of the container as a result of increased internal pressure. Further it is also desirable for the seal to be easily removable without contaminating the sample.

FIG. 1 shows a conventional insert for sealing a cylindrical NMR rotor, which is sealed at end 102. A conventional rotor insert consists of a tightly-fitting cylindrical Teflon plug 106 with a vent hole 108 in the center. The plug 106 is inserted into the open end 104 of the rotor 100. A plug 110 is screwed into the vent hole 108 after the insert 106 is pushed into the rotor 100 by inserting a wrench into the drive holes 112 and the assembly is completed with a drive cap 114 which is also pushed into the open end 104 of the rotor 100. The drive cap 114 has fins 116 against which a stream of compressed air is directed to rotate the rotor 100.

It has been found that the conventional insert 106 still leaks liquid through the plugged vent hole and between the insert and rotor wall due to capillary action. Once the insert starts to leak, it becomes lubricated by the solvent and may change position in the rotor to the extent that it may occasionally swap locations with the sample and interfere with the measurement. To prevent such leakage, it is conventional practice to add between the insert 106 and the cap 114 an additional protection layer, such as glue, silicone rubber, or wax (not shown). However, this additional layer reduces the available sample volume, adds an extra step in sample packing, can contaminate the liquid sample depending on the sealant, complicates removal of the insert, and may not survive cryogenic cooling.

SUMMARY

In accordance with the principles of the present invention, a plug is fabricated from a self-sealing inert elastomer and inserted into a container. During insertion, a tube transfixes the plug to allow air to escape as the plug is pushed into the container. After the plug has been seated in the container, the tube is withdrawn allowing the self-sealing elastomeric material to close the canal formed by the tube and to form a hermetic seal. The plug can be removed without contaminating the sample by tipping the plug in the rotor body by pressing in on one edge with a suitable tool and then removing the tipped plug with tweezers or a similar instrument.

In one embodiment of the invention, the plug is fabricated from silicone rubber.

DETAILED DESCRIPTION

Figure 1:
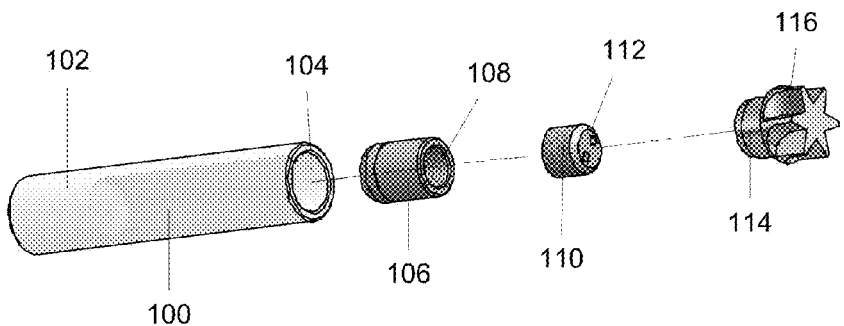
FIG. 1 is an exploded view of a conventional NMR rotor insert.
Figure 2:
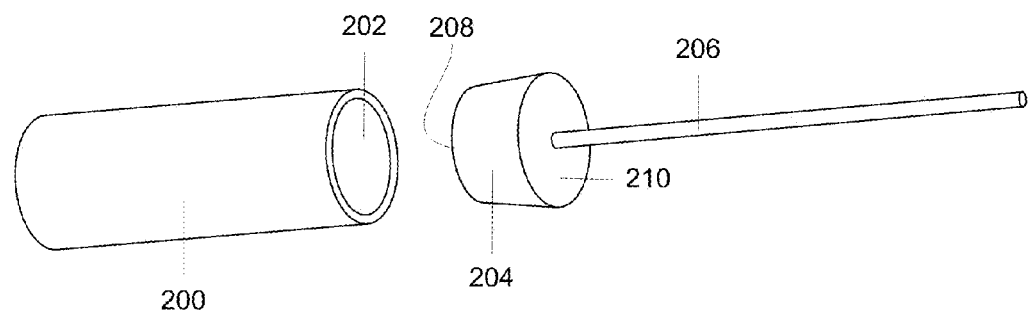
FIG. 2 is an exploded view of a container with the inventive vented elastomeric plug.
Figure 3:
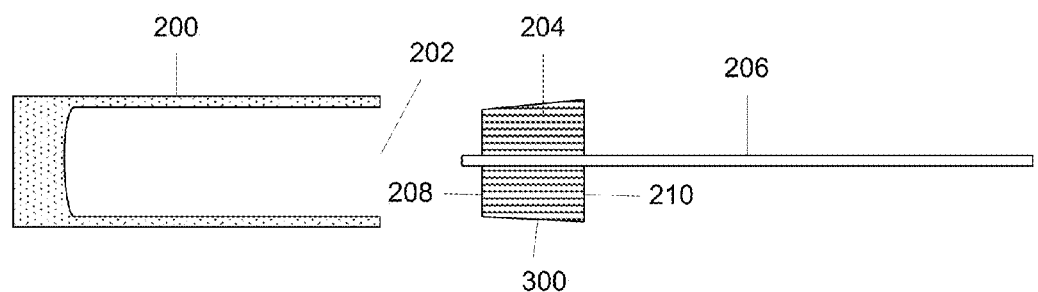
FIG. 3 is a cutaway side view of a container and the inventive vented elastomeric plug.

FIGS. 2 and 3 show one embodiment of the invention in which a self-sealing, plug 204 can be used to seal a container 200 which, for purposes of illustration, may be an NMR rotor 200. It will be apparent to those skilled in the art that the inventive plug 204 can be used to close other containers with similar requirements. Plug 204 is formed in the shape of a truncated cone in which the plug diameter is slightly smaller at the inner face 208 than the plug diameter at the outer face 210. In one embodiment the taper angle is substantially 2-5°. The tapered shape allows the plug to be easily inserted, but to compress during insertion in order to form a liquid-tight fit with the inner walls of the rotor 200. In order to allow air to escape when the plug 204 is inserted into the rotor 200, a small diameter tube or needle 206 is pushed through the plug 204 before insertion begins and removed after the plug has been inserted. A tube with a diameter of 0.35 mm is suitable for use with the invention. The tube may be fabricated from stainless steel or silica. Some silica tubes are coated with polymer blends that modify surface tension.

The plug 204 is fabricated of an elastomer capable of forming a durable, adaptive barrier between a liquid (or semi-liquid) sample in the rotor 200 and the portion of the rotor that receives the rotor drive cap. The elastomer must be inert (chemically and physically unresponsive to the contained sample) in order to prevent the sample from reacting with, or in anyway become contaminated by the nature of, the sample material. The plug material must also be self-sealing so that the puncture and canal of the air vent tube or needle will automatically seal to form a hermetic barrier. In order to form a reliable hermetic barrier, the plug must have a minimum height of about ⅓ the inner diameter of the rotor. However, in order to allow the plug to be tipped for removal, the plug height cannot exceed about ½ the inner diameter of the rotor body. For a rotor with an inner diameter of 3.2 mm, this gives a plug height of approximately 1 to 1.5 mm.

Certain polymers have sufficient elasticity and the required self-sealing properties. The surface cohesion of these materials allows them to recover from puncture and permeation. Materials suitable for use with the present invention include elastomers with a durometer between 35 A and 60 A, such as silicone rubber, natural rubber or nitrile rubber.

Figure 4:
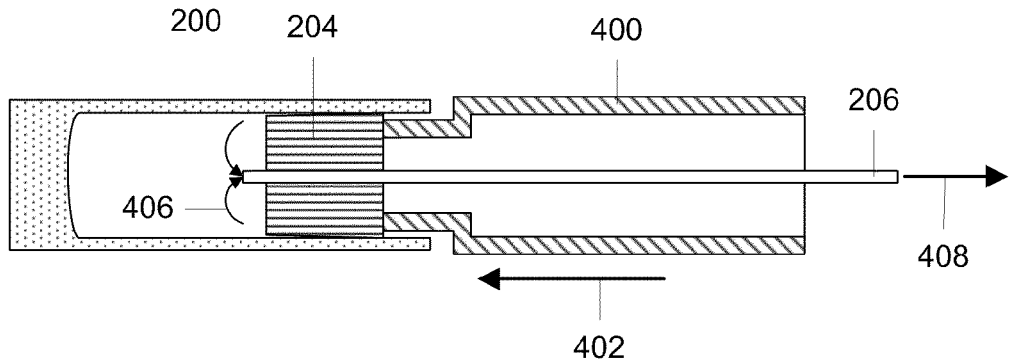
FIG. 4 is a cutaway side view illustrating insertion of the plug into a container with an insertion tool.
Figure 5:
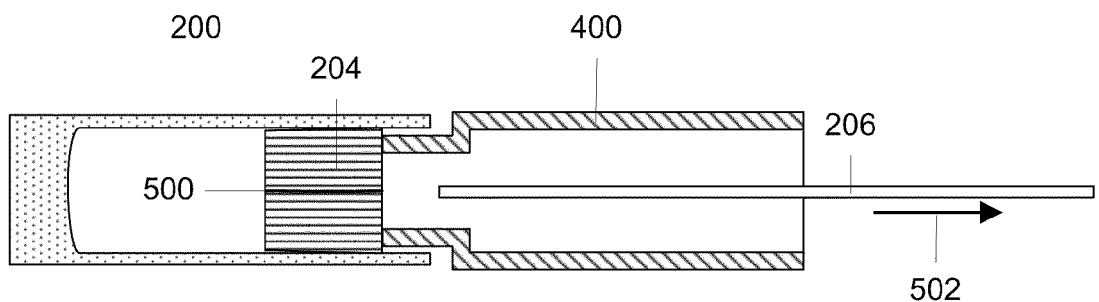
FIG. 5 is a cutaway side view illustrating withdrawal of the air vent tube, thereby allowing the plug to self-seal the canal caused by the needle.
Figure 6:
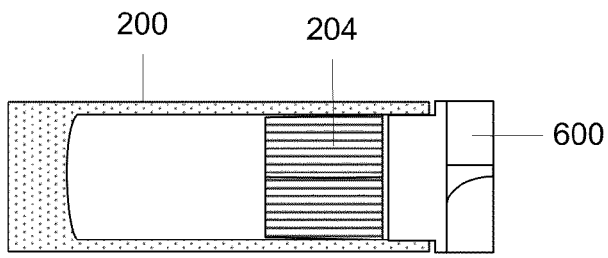
FIG. 6 is a partial cutaway side view illustrating a completed rotor assembly with a rotor cap installed.

FIGS. 4-6 illustrate the steps of sealing a rotor with the inventive sealing plug. In FIG. 4 the plug 204 is pushed into the rotor 200 by a suitable insertion tool 400 in the direction of arrow 402. During this process, plug 204 is compressed by the inner walls of rotor 200 to form a liquid-tight seal. Air trapped in the body of rotor 200 enters the tube 206 as illustrated by arrows 406 and exits the outer end of the tube 206 as illustrated by arrow 408.

Next, as illustrated in FIG. 5, the vent tube 206 is removed by pulling the free end in the direction of arrow 502 while maintaining the plug 204 in position with insertion tool 400. The removal of the vent tube leaves a perforation or canal 500 in the plug 204. However, due to the self-sealing properties of the plug material and the compression of the plug by the walls of rotor 200, this perforation is automatically sealed to prevent leakage. Finally, as shown in FIG. 6, the insertion tool 400 is removed and a drive cap 600 is inserted into the open end of the rotor to complete the assembly.

Although the elastomeric plug material may deform due to the cryogenic temperatures and the rotation of the rotor, any deformation imparted to the plug during the experimental conditions of cooling is reversed once the rotor and its contents are returned to atmospheric conditions. The plug 204 can also be easily removed so that the sample can be recovered for experimentation elsewhere. Removal can be accomplished by tipping the plug in the rotor body by pressing in on one edge with a suitable tool and then removing the tipped plug with tweezers or a similar instrument.

While the invention has been shown and described with reference to a number of embodiments thereof, it will be recognized by those skilled in the art that various changes in form and detail may be made herein without departing from the spirit and scope of the invention as defined by the appended claims.

What is claimed is:

1. An adaptive closure for hermetically sealing a container having an opening, the closure comprising:
   a plug fabricated from an elastomeric material and sized to fit tightly into the opening;
   a tube that transfixes the plug before the plug is inserted into the container so that air in the container passes through the tube as the plug is pushed into the opening; and
   a tool for removing the tube after the plug has been pushed into the opening to allow the plug material to close the canal left by the tube and form a hermetic seal.

2. The closure of claim 1 wherein the plug has a conical shape.

3. The closure of claim 1 wherein the plug is fabricated from silicon rubber.

4. The closure of claim 1 wherein the tool comprises an insertion tool that holds the plug in position when the tube is manually removed.

5. An NMR rotor which can be hermetically sealed to prevent leakage of liquid samples therein, comprising:
   a cylindrical rotor body which has an opening;
   a plug fabricated from an elastomeric material and sized to fit tightly into the opening;
   a tube that transfixes the plug before the plug is inserted into the rotor body so that air in the rotor body passes through the tube as the plug is pushed into the opening; and
   a tool for removing the tube after the plug has been pushed into the opening to allow the plug material to close the canal left by the tube and form a hermetic seal.

6. The rotor of claim 5 wherein the plug has a truncated conical shape.

7. The rotor of claim 6 wherein the conical shape has a taper angle of substantially 2-5°.

8. The rotor of claim 5 wherein the opening has an inner diameter and wherein the plug has a thickness between ⅓ and ½ of the inner diameter.

9. The rotor of claim 5 wherein the plug is fabricated from silicon rubber.

10. The rotor of claim 5 wherein the tool comprises an insertion tool that holds the plug in position when the tube is manually removed.

11. The rotor of claim 10 wherein the rotor body has a diameter and the insertion tool has a diameter smaller than the diameter of the rotor body so that the insertion tool can be used to push the plug into the rotor body.

12. A method for hermetically sealing an NMR rotor to prevent leakage of liquid samples therein, the rotor comprising a cylindrical rotor body which has an opening, comprising:
   (a) providing a plug fabricated from an elastomeric material and sized to fit tightly into the opening;
   (b) transfixing the plug with a tube before the plug is inserted into the rotor;
   (c) pushing the plug and tube into the opening with an insertion tool whereupon air in the rotor body passes through the tube as the plug is pushed into the opening; and
   (d) removing the tube while holding the plug in the opening with the insertion tool to allow the plug material to close the canal left by the tube and form a hermetic seal.

13. The method of claim 12 wherein step (a) comprises providing a plug with a truncated conical shape.

14. The method of claim 13 wherein step (c) comprises pushing the plug and tube into the opening with the smaller diameter of the plug entering the opening before the larger diameter of the plug.

15. The method of claim 13 wherein the conical shape has a taper angle of substantially 2-5°.

16. The method of claim 12 wherein the opening has an inner diameter and wherein step (a) comprises providing a plug with a thickness between ⅓ and ½ of the inner diameter.

17. The method of claim 12 wherein step (a) comprises providing a plug fabricated from silicon rubber.

18. The method of claim 12 further comprising:
   (e) tipping the plug in the rotor body by applying pressure to one edge of the plug; and
   (f) removing the plug from the rotor body.

* * * * *